(12) United States Patent
Bosshart

(10) Patent No.: US 7,683,688 B2
(45) Date of Patent: Mar. 23, 2010

(54) HIGH PERFORMANCE CLOCKED LATCHES AND DEVICES THEREFROM

(75) Inventor: Patrick Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 11/968,025

(22) Filed: Dec. 31, 2007

(65) Prior Publication Data
US 2009/0167396 A1 Jul. 2, 2009

(51) Int. Cl.
*H03K 3/12* (2006.01)
(52) U.S. Cl. ........................ 327/217; 327/208
(58) Field of Classification Search ......... 327/200–203, 327/207–212, 214, 217, 223, 229
See application file for complete search history.

(56) References Cited

U.S. PATENT DOCUMENTS

| | | | | |
|---|---|---|---|---|
| 5,821,775 A * | 10/1998 | Mehta et al. | | 326/98 |
| 5,825,224 A * | 10/1998 | Klass et al. | | 327/200 |
| 5,990,717 A * | 11/1999 | Partovi et al. | | 327/210 |
| 6,040,716 A | 3/2000 | Bosshart | | |
| 6,052,008 A * | 4/2000 | Chu et al. | | 327/200 |
| 6,326,814 B1 * | 12/2001 | Stasiak et al. | | 326/98 |
| 6,333,656 B1 * | 12/2001 | Schober | | 327/202 |
| 6,377,098 B1 * | 4/2002 | Rebeor | | 327/210 |
| 6,438,023 B1 * | 8/2002 | Johnson | | 365/154 |
| 6,642,763 B2 * | 11/2003 | Dike | | 327/202 |
| 6,879,186 B2 * | 4/2005 | Liu | | 326/98 |
| 6,914,453 B2 * | 7/2005 | Dhong et al. | | 326/98 |
| 6,972,605 B1 * | 12/2005 | Choe | | 327/200 |
| 2007/0143647 A1 * | 6/2007 | Klass | | 714/718 |

* cited by examiner

*Primary Examiner*—Lincoln Donovan
*Assistant Examiner*—Thomas J Hiltunen
(74) *Attorney, Agent, or Firm*—Dawn V. Stephens; Wade James Brady, III; Frederick J. Telecky, Jr.

(57) ABSTRACT

An integrated circuit (400) includes at least one clocked latch circuit (410). The clocked latch circuit (400) includes a first stage (415) including a latch node (420) positioned between a first pull up device (416) and a first (417) and at least a second pull down device (418), wherein the first stage (415) is operative to receive inputs comprising a data signal (D), a clock signal (CLK) and a clocked complement of the data signal (CDXX). A second stage (441) includes a second pull up device (442) and a third pull down device (445) having the latch node (420) therebetween, wherein at least one gate of the first pull up device (416) and the first (417) and second pull down device (418) is directly coupled to a gate of the second pull up device (442) or the third pull down device (445). An output inverter is coupled to the latch node (420). The clocked latch circuit is operable to pull the latch node (420) low under at least one logical combination of the inputs, and pull the latch node high under at least one other logical combination of the inputs.

20 Claims, 7 Drawing Sheets

US 7,683,688 B2

HIGH PERFORMANCE CLOCKED LATCHES AND DEVICES THEREFROM

TECHNICAL FIELD OF THE INVENTION

The present invention relates generally to clocked latch circuits.

BACKGROUND OF THE INVENTION

When designing circuitry using dynamic logic such as domino logic gates, it is often the case that signals produced by these domino gates are dual-rail, with one clocked signal representing a data 1 and the other clocked signal representing a data 0. These signals are in the appropriate form to apply as inputs to a subsequent dynamic gate, such as a domino logic gate. In these systems, some of the slower circuitry may be implemented in static logic in order to reduce power dissipation. However, dual rail clocked signals are not in the form that the static logic portion of the circuitry can generally use. In order to be useful to static gates, it is customary that the signals be latched.

FIG. 1 shows typical clocked signal and latched signal waveforms. Whereas clocked signals rise on the rising edge of a clock signal elk after some delay and fall on its falling edge with some delay, latched signals transition in either direction (both transition directions shown in FIG. 1) on the rising edges of elk after some time delay.

One application where it may be desirable to convert clocked signals to static signals is where the signal must simply be sent through one or more levels of latch in order to pass it through one or more stages of a pipeline. Normally this can be considered to occur in two steps. In a first step a circuit converts the clocked signals to static signals, then in a second step the static signals are clocked by the first level of latch. One circuit which can combine these two operations is a clocked RS latch. When circuits operate at very high frequencies, pipelining signals through registers becomes increasingly difficult, because the delays of the latches and registers themselves become a large fraction of the clock cycle, leaving little additional delay for other operations, which might include simple logic functions. In that case, combining the functions of dynamic to static conversion and latching results in a substantial reduction in latency, which can be a requirement at high frequencies for certain applications.

FIG. 2A shows a schematic of a conventional and-or-invert (AOI) based clocked RS latch circuit 200. RS latch circuit 200 comprises a pair of cross coupled AOI21 gates 201 and 202 and output inverters 206 and 207. FIG. 2B shows a schematic of a conventional AOI21 gate 200 that can implement AOI21 gates 201 and 202. Referring again to FIG. 2A, the inputs to RS latch circuit 200 are two dual rail clocked signals (D, Dx) and its outputs are complementary static latched signals (L, Lx). It is expected that D and DX are not both high at the same time. When the CLK and D inputs are both high, the AOI gate latch node NX goes low and the latch output L goes high. NX going low forces its other latch node N high given that DX is low, and LX goes low. It is intended that when the CLK is high, both D and DX are not allowed to be high; at least one of them must be low. There are two signal inversions from D rising to L rising, and three signal inversions to LX falling. Two of the inversions are through complex gates. Moreover, there are six (6) transistors pulling up or down on latch nodes Nx and N. As shown in FIG. 2B, 4 transistors are shown directly coupled to node Y which becomes the latch node in RS latch circuit 200, with 2 additional transistor directly coupled to node Y via the cross coupling connection back to the input of the other AIO21 gate. As a result, the delay of AOI-based RS latch circuit 200 is relatively long.

In spite of its latency issues, clocked RS latch circuit 200 has advantages over using a standard clocked D-type latch, an example of which is clocked D-type latch 300 shown in FIG. 3. For D-type latch 300, if the data (D) input, which is assumed to be a clocked signal like the D input in FIG. 2A, does not align its edges precisely with the clock, problems generally occur. If the leading edge of the data is late, the latch 300 may start flipping towards the wrong state, only to have to recover later from this false transition. If the trailing edge of the data is early, the clock will then start to capture an incorrect final value. For that reason, the AOI-based RS latch 200 shown in FIG. 2A may be preferable compared to D-type latch 300, although its latency may not be as good as desired. What is needed is a robust clocked latch design that provides less latency.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An integrated circuit includes at least one clocked latch circuit. The clocked latch circuit includes a first stage including a latch node positioned between a first pull up device and a first and at least a second pull down device, wherein the first stage is operative to receive inputs comprising a data signal (D), a clock signal (CLK) and a clocked complement of the data signal (CDXX). A second stage includes a second pull up device and a third pull down device having the latch node therebetween, wherein at least one gate of the first pull up device and the first and second pull down device is directly coupled to a gate of the second pull up device or the third pull down device. An output inverter is coupled to the latch node. The clocked latch circuit is operable to pull the latch node low under at least one logical combination of the inputs, and pull the latch node high under at least one other logical combination of the inputs.

As defined herein, "directly coupled" refers to a low resistance connection without any intervening devices, such as diodes or transistors. An output inverter is coupled to the latch node, an can be used as the output of clocked latch circuit. Hold circuitry can be coupled between the output of the output inverter and the latch node operative to hold the output of the output inverter in its prior state except for at least one logical combination of inputs.

DETAILED DESCRIPTION

Figure 1:
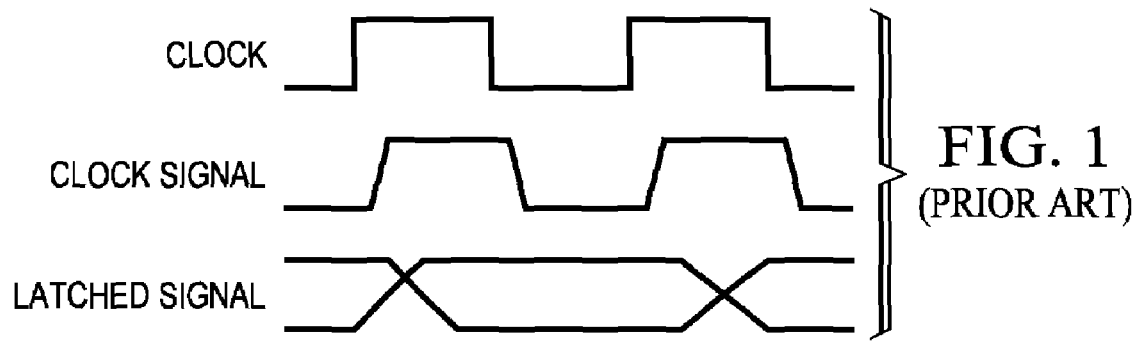
FIG. 1 shows conventional clocked signal and latched signal waveforms.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention.

Figure 4A:
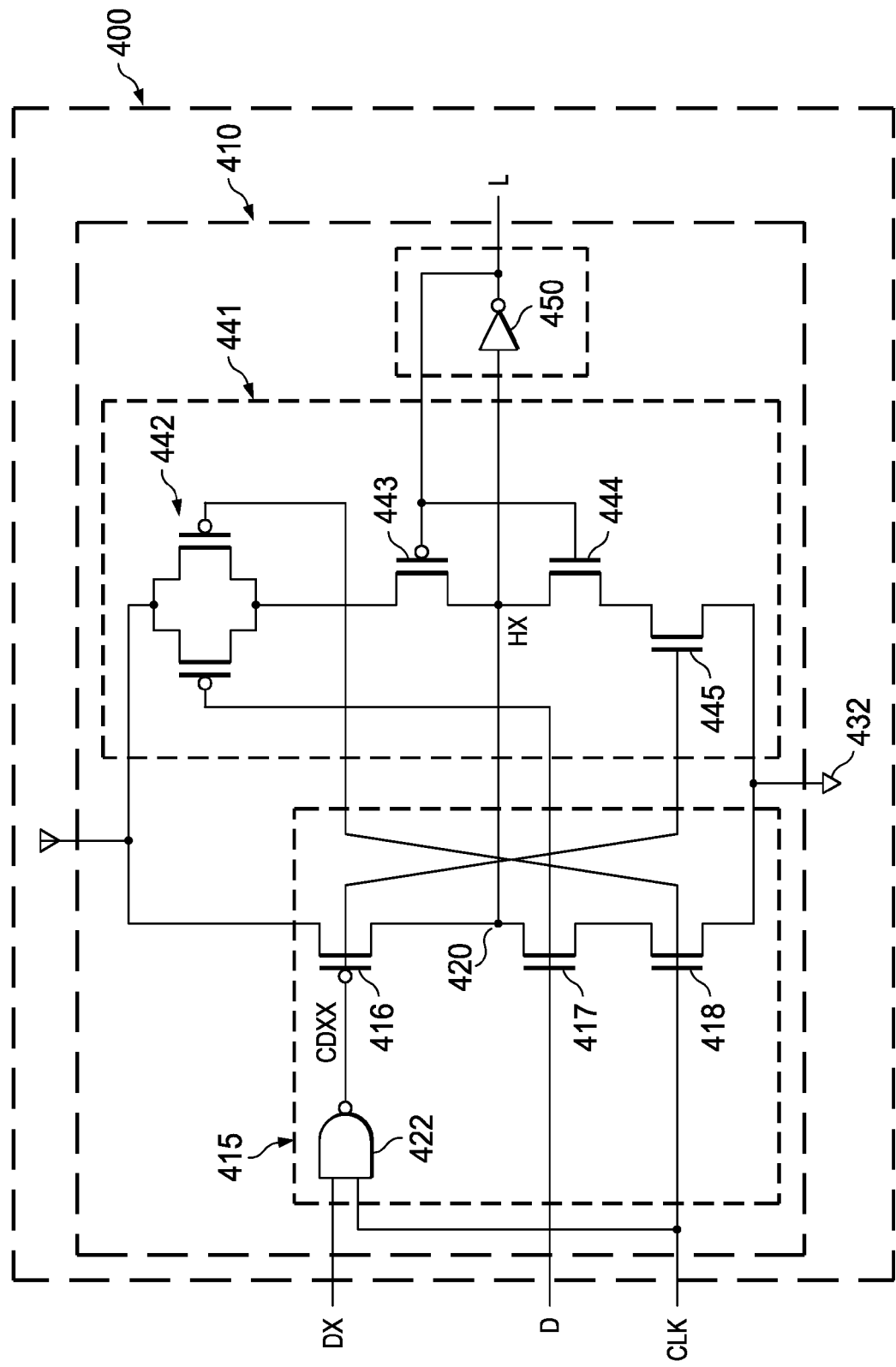
FIG. 4A shows an integrated circuit including a clocked RS latch according to an embodiment of the invention.

FIG. 4A shows an exemplary integrated circuit 400 including a clocked RS latch 410 according to an embodiment of the invention. The clocked latch circuit 410 comprises a first stage 415 comprising a first plurality of series coupled devices 416-418 including a latch node 420 therebetween positioned between positive supply 431 and negative power supply 432 (shown as ground). The devices 416-418 are operative to receive inputs comprising a data signal (D), a clock signal (CLK), and a clocked complement of the data signal (CDXX), and pull the latch node 420 low under at least one logical combination of inputs and pull the latch node high under at least one other logical combination of inputs. In the embodiment shown in FIG. 4A, device 416 is operative to receive CDXX, device 417 is operative to receive D, and device 418 is operative to CLK. In the embodiment shown in FIG. 4A, NAND gate 422 receives both the CLK signal and a complement of the data signal DX and provides CDXX to device 416.

A second stage 441 of clocked latch circuit 410 comprises a second plurality of series coupled devices 442-445 including the latch node 420 therebetween. At least one gate of the first plurality of series coupled devices 416-418 is directly coupled to a gate of the second plurality of series coupled devices 442-445. In the embodiment shown in FIG. 4A, the gates of devices 416 and 445 are directly coupled, as are the gates of devices 417 and 418 to the respective gates of the common source PMOS pair 442. An output inverter 450 is coupled to the storage node 420. An output of the output inverter 450 can be used as an output (L) for the clocked latch circuit 410.

Clocked latch circuit 410 generally includes keeper circuitry for holding certain nodes that may otherwise float. Transistors 443 and 444 function as hold circuitry and have their gates coupled to the output of the latch circuit (L) and one terminal coupled to the latch node 420 and are operative to hold the output of the clocked latch circuit (L) in its prior state except for at least one logical combination of the inputs. Similarly, PMOS pair 442 also provides the keeper function for the node at the drain of transistor 443. Keeper circuits other than those shown may be used with the invention.

Regarding operation of clocked latch circuit 410, when both CLK and D inputs are high, the latch node 420 is pulled low through NMOS devices 418 and 417. When both CLK and DX inputs are high, the output CDXX of the NAND gate 422 goes low, latch node 420 is forced high and output L low. When both D and DX are low, or CLK is low, the latch node 420 is not driven from the inputs in combination first stage 415 comprising devices 416-418, and is held in its prior state by the hold circuitry comprising feedback devices 443 and 444. Device 444 holds latch node 420 low if the NAND gate output CDXX is not trying to pull latch node 420 high. Likewise, device 443 holds the latch node 420 high unless both D and CLK are high. In the case both D and CLK are high, the latch node 420 is pulled low.

Figure 2A:
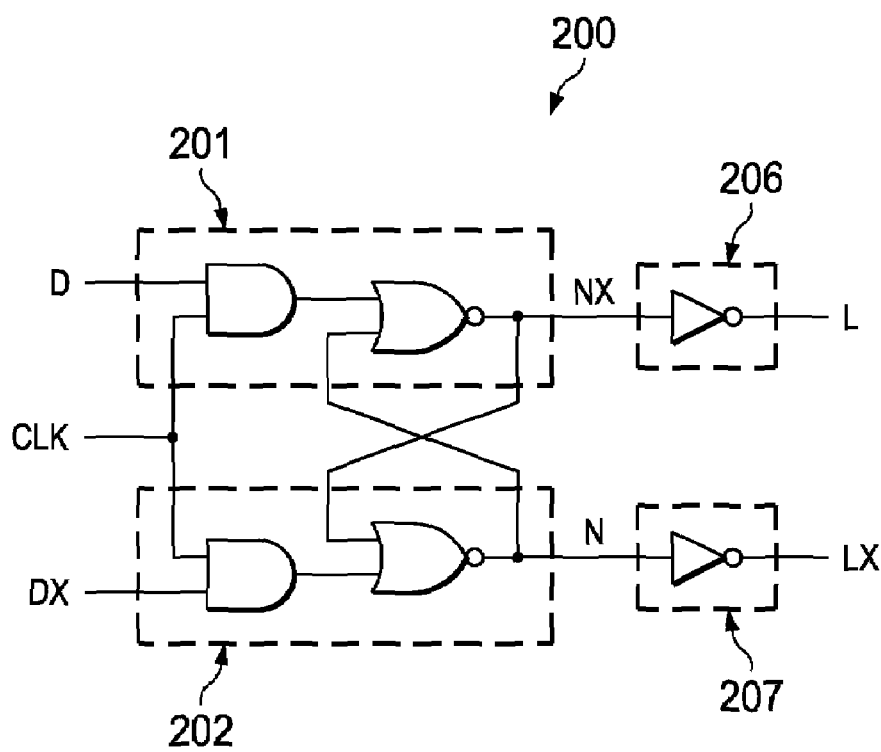
FIG. 2A shows a conventional and-or invert (AOI) based clocked RS latch.
Figure 2B:
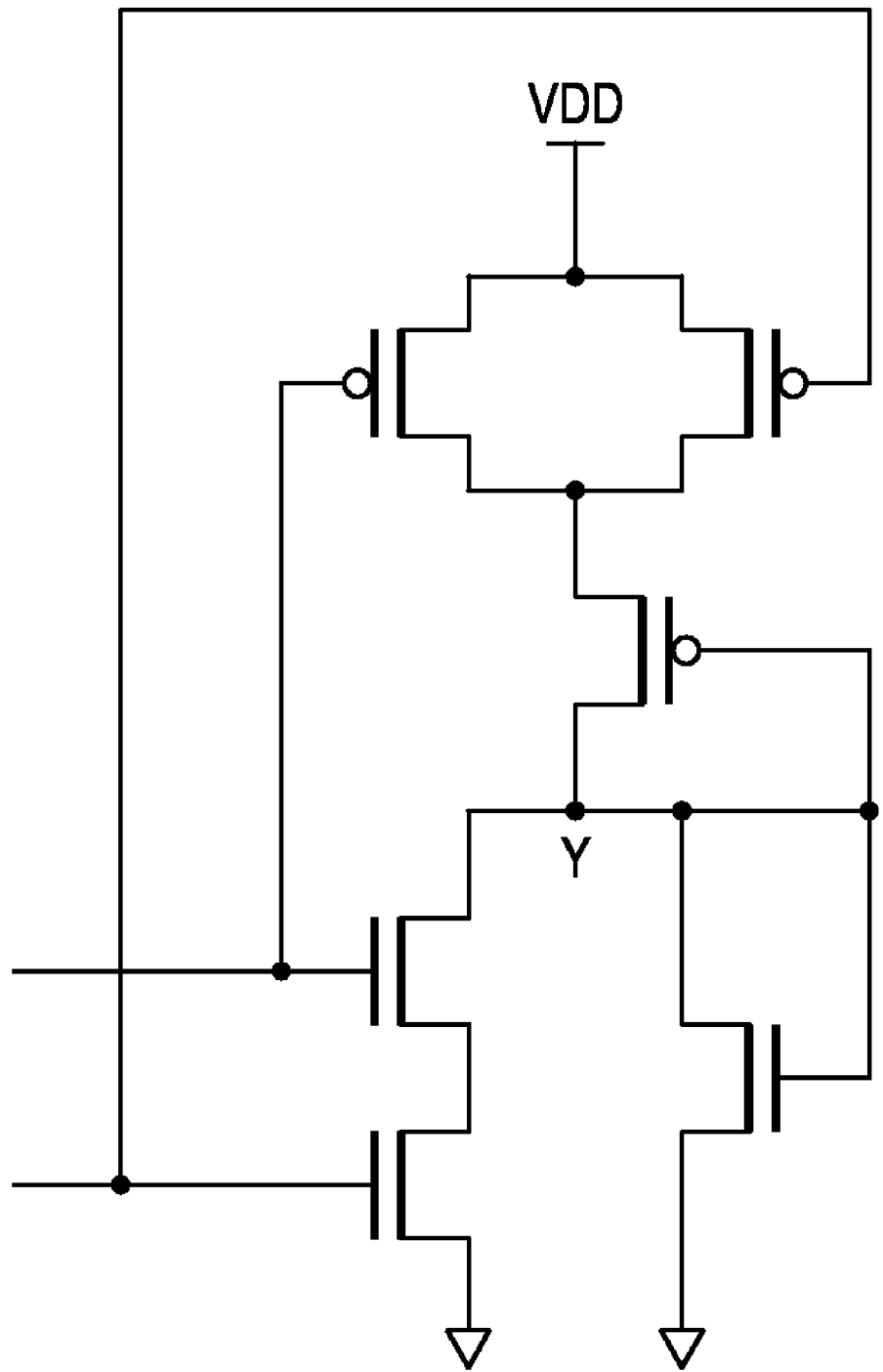
FIG. 2B shows a schematic of a conventional AOI21 gate that can be cross coupled to another AOI21 gate to implement the conventional and-or invert (AOI) based clocked RS latch shown in FIG. 2A.
Figure 3:
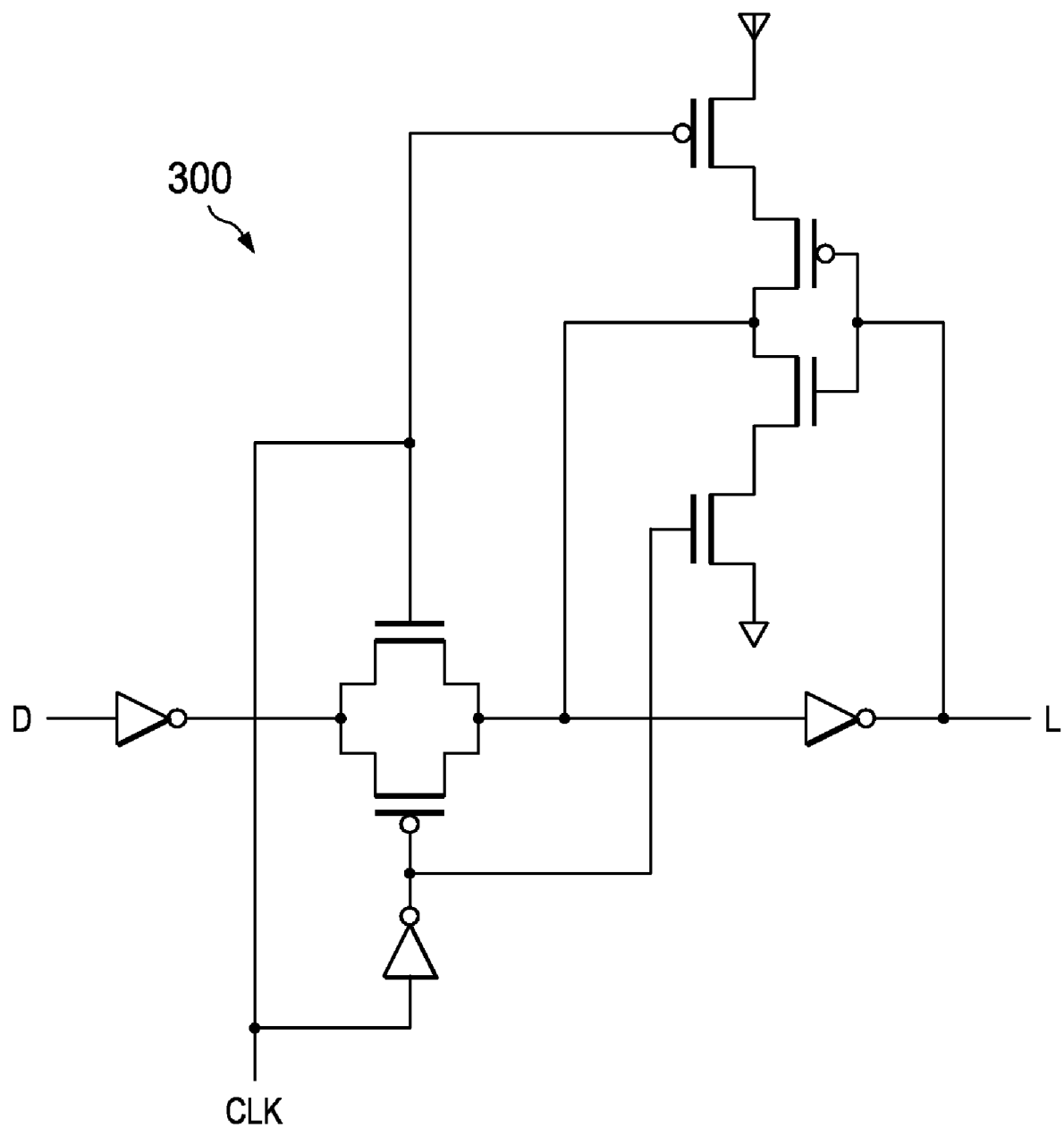
FIG. 3 shows a conventional clocked D type latch.

Analogous to the conventional AOI-based clocked RS latch 200 shown in FIG. 2, for the clocked RS latch 410 according to an embodiment of the invention shown in FIG. 4 there are two (2) signal inversions from the rising edges of D and CLK to the rising edge of the output L, and there are three (3) signal inversions from the rising edges of DX and CLK to the falling edge of the output L. However, the delay of most of these inversions for clocked RS latch 410 will be faster than their corresponding inversions in conventional AOI-based clocked RS latch 200 as explained below. As described above, in latch 410 when both U and CLK go high, they pull the latch node 420 low. Other than the generally significantly smaller feedback devices 443, 444 which may be ignored in a capacitance analysis, there are three transistors pulling up or down on latch node 420, in comparison with 6 transistors on the latch nodes for the AOI21-based clocked RS latch shown in FIG. 2A as described above. With significantly less capacitance on latch node 420, clocked latch circuits according to the invention, such as clocked latch circuit 410, will transition significantly faster as compared to the output of AOI21-based clocked RS latch 200 shown in FIG. 2A.

As described above, when both DX and CLK rise, they cause the output of the NAND gate 422 output CDXX to fall, forcing latch node 420 high and output L low. This will be a significantly faster transition than the corresponding transition in AOI-based clocked RS latch 200 shown in FIG. 2A. The second transition is when latch node 420 rises, pulled high by PMOS pull up device 416. This is a significantly faster transition than the conventional AOI-based clocked RS latch 200 rising output, because there is one transistor (PMOS 416) in series rather than two series devices in the conventional AOI-based clocked RS latch 200.

One additional advantage of clocked RS latch 400 occurs because when the devices 417 and 418 are turning on to pull latch node 420 low, device 416 is off, so there is no drive current fight during the transition. This is in contrast to the case of the AOI-based clocked RS latch 200 shown in FIG. 2A, where when the AOI output node is being pulled in one direction as those devices turn on, they are fighting currents pulling in the opposite direction from the opposite devices which are in the process of turning off.

Figure 4B:
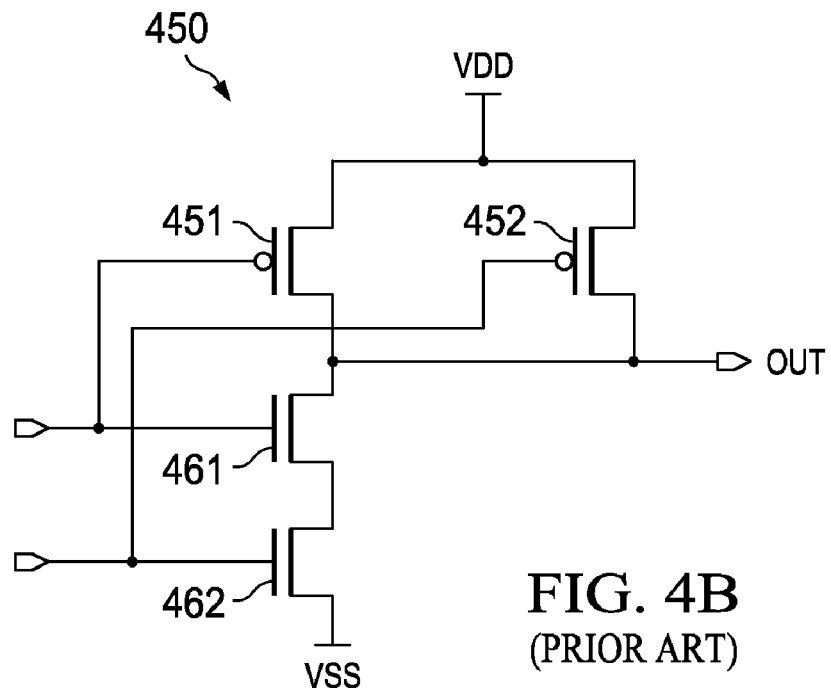
FIG. 4B is the schematic of a conventional NAND gate.

In one embodiment of the present invention, the transistor geometries in NAND gate 422 are skewed. FIG. 4B is a schematic of a conventional NAND gate 450. NAND gate 450 includes PMOS gates 451 and 452, and NMOS gates 461 and 462. PMOS gates 451 and 452 control the falling transition, while NMOS gates 461 and 462 control the rising transition. A standard ratio of PMOS to NMOS which is generally reflected for NAND-based logic is 1.0. As used herein, a "larger" transistor in NAND logic refers to a W/L ratio of the larger transistor being at least 10%, such as at least 25% greater than the W/L ratio using the standard ratio (1.0). By increasing W/L ratio of the NMOS transistors 461 and 462 relative to the PMOS transistors 451 and 452 for the NAND gate, such as to provide a W/L of at least 10% larger, such as 25% larger, the critical falling transition is sped up, while slowing the rising transition (due to slower PMOS) which is generally of no significant consequence because it causes no further activity in normal operation.

Figure 5:
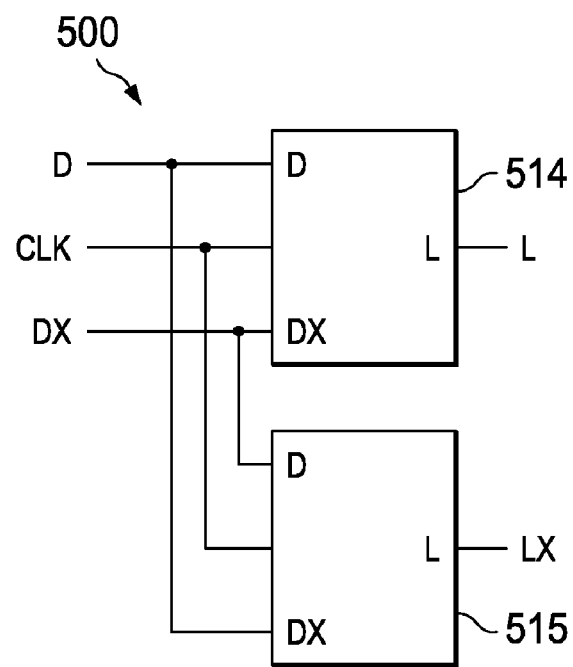
FIG. 5 shows an arrangement of two of RS latches for generating complementary latched outputs, according to another embodiment of the invention.

If complementary latched outputs are desired without the delay of an additional inverter to create the opposite output, two clocked latches, such as two clocked RS latches according to the invention, for example RS latch 410, may be used with their respective data inputs interchanged. FIG. 5 shows an RS latch arrangement 500 according to an embodiment of the invention which is a complementary output version of the clocked RS latch shown in FIG. 4 comprising latches 514 and 515. The clocked RS latches 514 and 515 are connected with swapped inputs D and DX. This circuit arrangement may be used when complementary output signals both with minimum latency are desired. Alternatively, an additional output inverter could be added to the L output of clocked RS latch 410 to provide as complementary output at the cost of the delay of that additional inversion. However, clocked RS latch arrangement 500 as shown in FIG. 5 avoids such a delay.

Figure 6:
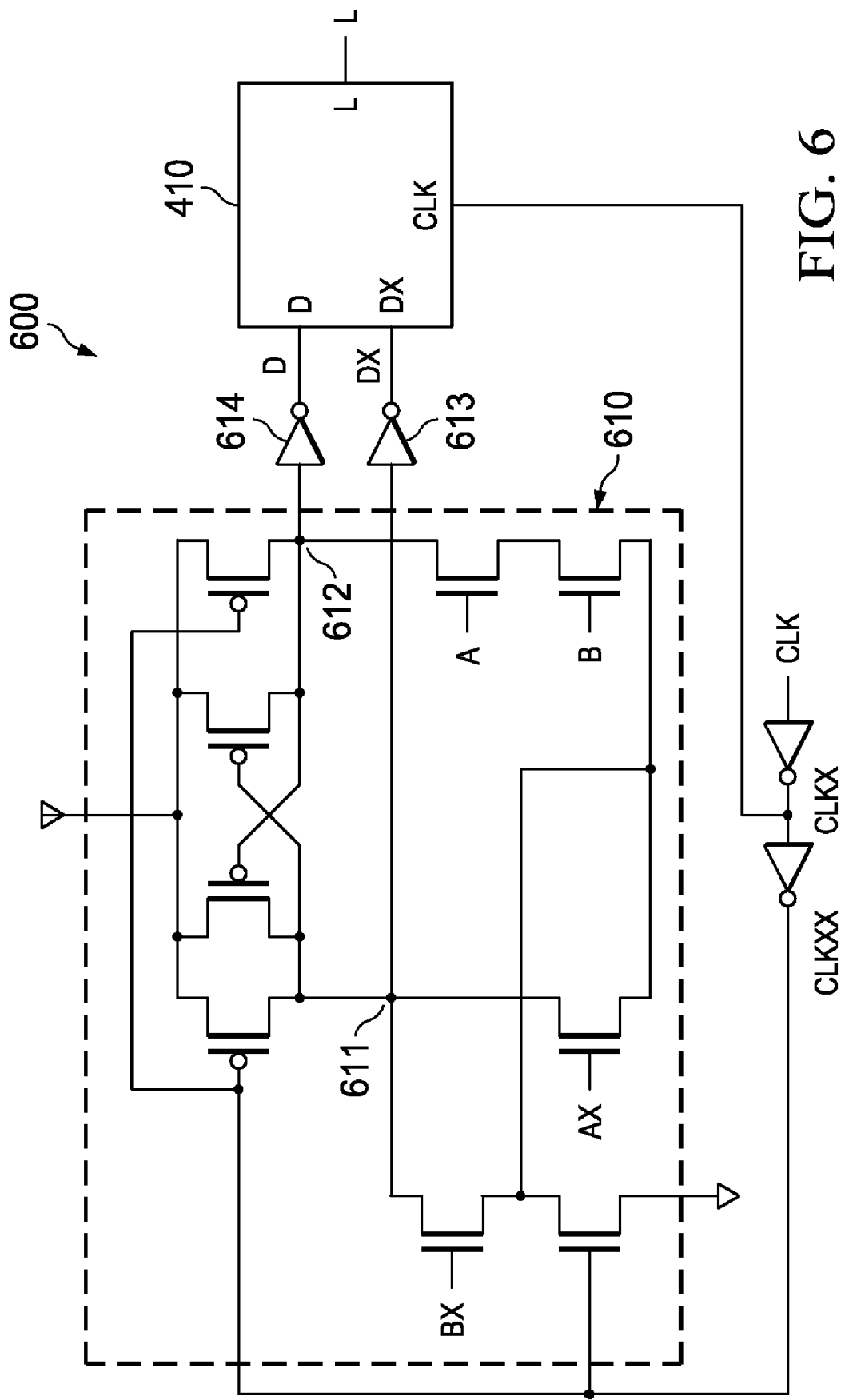
FIG. 6 shows the clocked RS latch of FIG. 4 in operation receiving data from a domino logic gate, according to an embodiment of the invention.

One exemplary application for the clocked latches according to embodiments of the invention is to create a dynamic gate, such as a domino gate, with a clocked latched output as shown in FIG. 6. FIG. 6 shows a circuit arrangement 600 comprising the clocked RS latch 410 of FIG. 4 in operation receiving data from a domino logic gate 610. Specifically, the inputs DX and D of clocked RS latch 410 are connected to the domino gate dynamic output nodes 611 and 612 through inverters 613 and 614, respectively.

Normally clocked latch 410 might be expected to receive a clock which is of the same phase as the clock driving the domino gate at its input. While circuit arrangement 600 will be operable in that configuration, FIG. 6 shows the domino gate 610 running off clock CLKXX (delayed by two signal inversions), which is of the same phase as the input signal CLK, while the clocked RS latch 410 runs off the oppositely phased signal CLKX (delayed by one signal inversion). This makes the input signals D and DX have a clock phase opposite to the clock phase provided to clocked RS latch 410. It might be expected that just as the clock of the RS latch 410 is turning on, the input signals D and DX are returning to zero. However, a count of logic inversions reveals that the D and DX inputs go back to zero after three inversion delays following when the clock of the RS latch 410 (CLKX) clock turns on. The domino gate clock CLKXX falling edge is one inversion delay after the rising edge of RS latch's clock CLKX. Furthermore, the domino gate 610 has internal to it two signal inversions which further delay the falling edges of D and DX. So in practice, when the clock CLKX to the RS latch 410 is enabled by its rising edge, there generally remains three signal inversion delays of time when the D or DX signal may trigger the RS latch 410 before the signals go back to zero. In this way, the signals are latched into the clock phase following the clock phase of the domino gate 610. The domino gate 610 shown implements the logic function of the gate (in this example the AND of inputs A and B) and also delays the output by one latch phase so it does not switch until the input clock signal CLK is low. This combination of the logic function of the domino gate 610 with the latching function of the output clocked RS latch 410 thus can be done with less delay than the conventional approach of implementing the domino gate, RS latching the outputs of the domino gate to convert them to static signals and then going through an additional D type latch to delay the signal until the CLK low phase.

Figure 7:
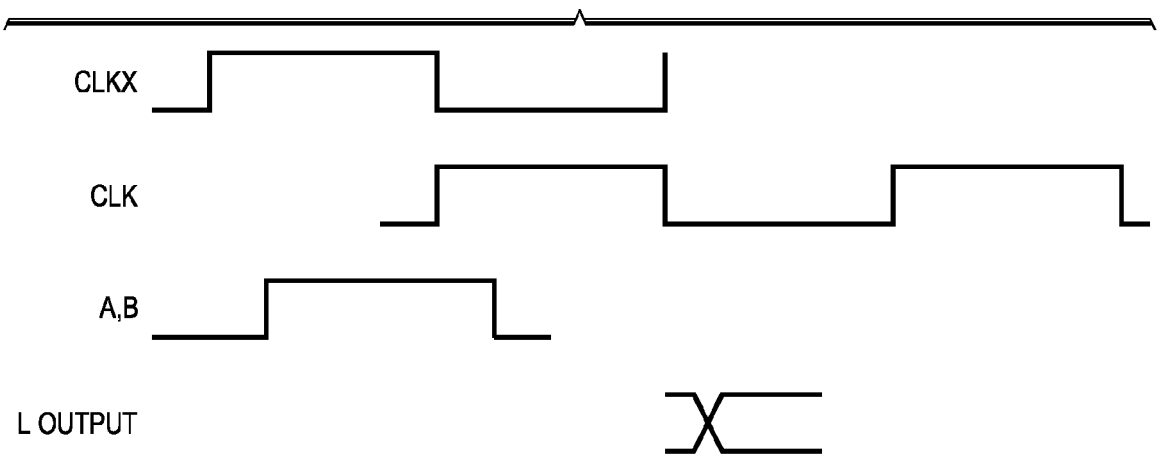
FIG. 7 shows operation of the domino gate in a hold-time-latching configuration, according to an embodiment of the invention.

FIG. 7 shows signal waveforms demonstrating the operation of the domino gate 610 of circuit arrangement 600 in a hold-time-latching configuration. Inputs A and B for domino gate 610 are gated versions of the negative clock CLKX. If they are a delayed version of CLKX and have at least 3 inversions of overlap with the domino gate clock CLKX, then they can trigger the discharge of the domino gate dynamic nodes 611 and 612. In this configuration, circuit arrangement 600 shown in FIG. 6 combines the AND function of inputs A and B with two levels of pipeline latching.

Figure 8:
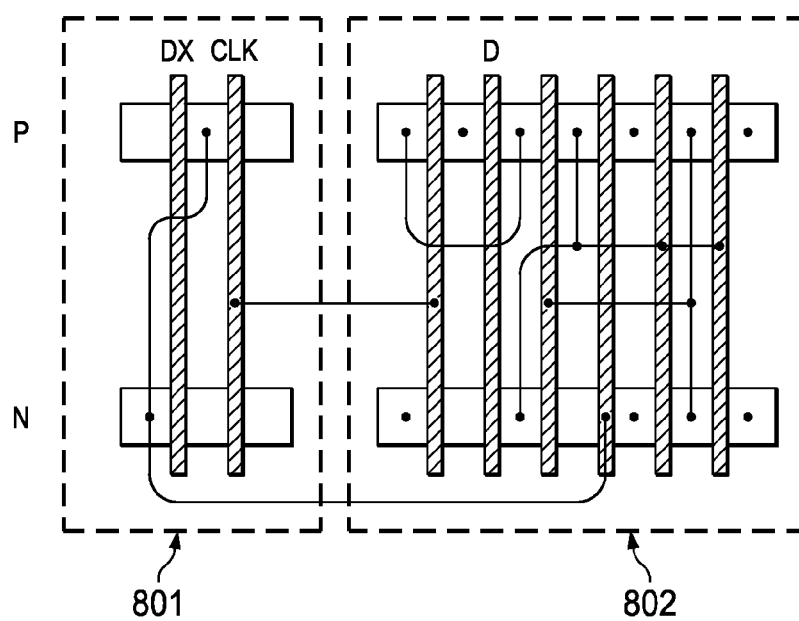
FIG. 8 shows an exemplary layout of a clocked RS latch, according to an embodiment of the invention.

FIG. 8 shows an exemplary layout of an RS latch according to an embodiment of the invention that implements the clocked RS latch 410 shown in FIG. 4. Reference 801 refers to NAND gate while reference 802 refers to other transistors in clocked RS latch 410 shown in FIG. 4. The layout shown can be used to provide a more efficient layout particularly when the holding devices 443 and 444 shown in FIG. 4A are at the top of the feedback transistor stack and as such are connected directly to the storage node 420. In that case, the 8 transistors shown in FIG. 4A can be arranged in two rows with straight polysilicon comprising gates (polysilicon=thin vertical lines). The other lines shown are metal lines. One row can provide NMOS devices 417, 418, 444 and 445, while the other row can provide PMOS devices comprising PMOS devices 416, and the PMOS pair 442 and PMOS 443.

Although a clocked RS latch has been discussed in accordance with the present invention, it is appreciated by the Inventor that other transistor technology variations, and devices other than clocked RS latches are contemplated in the context of the present invention. For example, as known in the art, RS flip-flops can be realized from two RS clocked latches which operate on opposite halves of a clock signal. Moreover, as known in the art, JK flip-flops, D flip-flops and T flip-flops can easily be derived from RS flip-flops. For example, in the case of a D flip-flop, the R input is replaced with an inverted version of the S input, which thereby becomes D. This change is only needed in the master latch section; the slave latch remains unchanged.

Moreover, the invention is also not limited to the use of silicon wafers. In addition, although described based on CMOS designs, BiMOS designs may also be used.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclo-

I claim:

1. An integrated circuit comprising:
at least one clocked latch circuit, said clocked latch circuit comprising:
a first stage comprising a latch node positioned between a first pull up device and a first and at least a second pull down device, said first stage operative to receive inputs comprising a data signal, a clock signal and a clocked complement of said data signal,
a second stage comprising a second pull up device and a third pull down device having said latch node therebetween, wherein at least one gate of said first pull up device and said first and second pull down device is directly coupled to at least one gate of said second pull up device and said third pull down device, and
an output inverter coupled to said latch node,
wherein said clocked latch circuit is operable to pull said latch node low under at least one logical combination of said inputs, and pull said latch node high under at least one other logical combination of said inputs, and
wherein said first pull down device comprises a first NMOS input transistor operative to receive said data signal, said second pull down device comprises a second NMOS input transistor operative to receive said clock signal, and said first pull up device comprises a first PMOS input transistor operative to receive said clocked complement of said data signal, wherein said latch node is between said second NMOS input transistor and said first PMOS input transistor.

2. The integrated circuit of claim 1, further comprising hold circuitry coupled between said output of said latch circuit and said latch node operative to hold said output of said clocked latch circuit in its prior state.

3. The integrated circuit of claim 1, wherein said second pull up device comprises a common source PMOS transistor pair, wherein said data signal is coupled to a gate of a first of said PMOS pair and said clock signal is coupled to a gate of the other of said PMOS pair.

4. The integrated circuit of claim 3, wherein a gate of said first PMOS transistor is coupled to a gate of said third pull down device and a gate of said first NMOS input transistor and said second NMOS input transistor are coupled to respective gates of said PMOS transistor pair.

5. The integrated circuit of claim 1, further comprising a NAND gate operative to receive said clock signal and a complement of said data signal and generate said clocked complement of said data signal, said clocked complement of said data signal coupled to a gate of said first pull up device.

6. The integrated circuit of claim 5, wherein said NAND gate comprises NMOS transistors and PMOS transistors, wherein at least one of said NMOS transistors of said NAND gate is sized larger than at least one of said PMOS transistors of said NAND gate.

7. An integrated circuit comprising:
at least one clocked RS latch circuit, said clocked latch circuit comprising:
a first stage comprising a latch node positioned between a first PMOS pull up device and a first and at least a second NMOS pull down device, said first stage operative to receive inputs comprising a data signal, a clock signal and a clocked complement of said data;
a second stage comprising a second PMOS pull up device and a third NMOS pull down device having said latch node therebetween, wherein at least one gate of said first PMOS pull up device and said first and second NMOS pull down device is directly coupled to at least one gate of said second PMOS pull up device and said third NMOS pull down device;
an output inverter coupled to said latch node, and
hold circuitry comprising a first and a second hold transistor having a source or drain coupled to said latch node and their gates directly coupled, said gates of said first and a second hold transistor coupled to an output of said output inverter operative to hold said output in its prior state,
wherein said clocked latch circuit is operable to pull said latch node low under at least one logical combination of said inputs, and pull said latch node high under at least one other logical combination of said inputs, and
wherein said at least one clocked latch circuit comprises a first and a second of said clocked latch circuit for providing complementary outputs, wherein said first and second latch circuits have said data signal and said and said complement of said data signal swapped relative to one another.

8. The integrated circuit of claim 7, further comprising at least one domino logic gate having first and second dynamic nodes, wherein said first and said second dynamic nodes are coupled to said first stage of said clocked latch circuit.

9. The integrated circuit of claim 7, wherein a clock for said domino logic gate is delayed from said clock for said clocked latch circuit by an odd number of inversions.

10. An integrated circuit, comprising:
at least one clocked latch circuit comprising:
a latched node;
a pull up device coupled to a high voltage supply and the latched node;
a series-coupled, pull down device coupled to the latched node and a low voltage supply, wherein the series-coupled, pull down device is coupled to receive a first data signal and a first clock signal;
a first logic gate coupled to the first pull up device and coupled to receive the clock signal and a second data signal;
a hold circuit coupled to the latched node and an output node;
a pull up pair coupled to the hold circuit, the high voltage supply, and the series-coupled pull down device;
a pull down device coupled to the hold circuit, the low voltage supply, and the pull up device; and
an inverter coupled to the latched node and the output node, wherein the latched node is a low capacitance node enabling faster transitions from being pulled low to being pulled high, which reduces latency.

11. The integrated circuit of claim 10, wherein the logic gate is a skewed input NAND gate.

12. The integrated circuit of claim 10, wherein pull up device does not have a drive current opposing a transition when the series-coupled pull down device is turning on.

13. The integrated circuit of claim 10, wherein said at least one clocked latch circuit comprises a first and a second of said clocked latch circuit for providing complementary outputs, wherein said first and second latch circuits have said data signal and said complement of said data signal swapped relative to one another.

14. The integrated circuit of claim 10, further comprising at least one dynamic logic gate having first and second dynamic nodes, wherein said first and said second dynamic nodes are coupled to said first stage of said clocked latch circuit.

15. The integrated circuit of claim 14, wherein said dynamic logic gate comprises a domino logic gate.

16. The integrated circuit of claim 14, wherein a clock for said dynamic logic gate is of opposite phase relative to a phase of said clock signal for said clocked latch circuit.

17. The integrated circuit of claim 16, wherein a clock for said dynamic logic gate is delayed from said clock for said clocked latch circuit by an odd number of inversions.

18. The integrated circuit of claim 14, wherein data inputs to said dynamic gate are clocked signals of opposite phase to a dynamic gate clock, and have a delay from a turn-on edge of said clock for said dynamic gate to a turn-off edge of said data inputs.

19. The integrated circuit of claim 18, wherein said delay is sufficient to discharge the said first and second dynamic nodes.

20. The integrated circuit of claim 10, wherein said clocked latch circuit comprises a clocked RS latch.

* * * * *